US006248167B1

(12) United States Patent
Okamoto et al.

(10) Patent No.: US 6,248,167 B1
(45) Date of Patent: Jun. 19, 2001

(54) METHOD FOR SINGLE CRYSTAL GROWTH AND GROWTH APPARATUS

(75) Inventors: Tsutomu Okamoto; Koichi Tatsuki; Shigeo Kubota, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/238,901

(22) Filed: Jan. 28, 1999

(30) Foreign Application Priority Data

Feb. 6, 1998 (JP) .................................................. 10-025371

(51) Int. Cl.[7] .................................................... C30B 7/08
(52) U.S. Cl. ...................................... 117/28; 117/2; 117/3
(58) Field of Search .................................. 117/2, 3, 28

(56) References Cited

U.S. PATENT DOCUMENTS 5,343,827 * 9/1994 Bordui et al. ........................... 117/28

FOREIGN PATENT DOCUMENTS

02279583A * 1/1990 (JP).
02172891A * 7/1990 (JP).

OTHER PUBLICATIONS

"beta–Ba B₂O4, single crystal obtained by Czochralsk; method", Lukasiewisz, et al Inst–Electronic Materials Technology, Material Elektron, (1994), 221), pp. 84–89. (Abstract only), 1994.*

* cited by examiner

Primary Examiner—Felisa Hiteshew
(74) Attorney, Agent, or Firm—Hill & Simpson

(57) ABSTRACT

Disclosed is a method for the growth of a single crystal having excellent crystallinity, uniform quality in the inside thereof and hence excellently uniform optical properties, the method enabling an improvement in yields. The invention resides in a method for the growth of a single crystal of β-type barium borate ($\beta$-$BaB_2O_4$), the method comprising heating a crucible 6 indirectly to grow a $\beta$-$BaB_2O_4$ single crystal 21 from a melt of barium borate ($BaB_2O_4$) contained in the crucible and using no flux by using a seed crystal 9 of $\beta$-$BaB_2O_4$.

4 Claims, 11 Drawing Sheets

METHOD FOR SINGLE CRYSTAL GROWTH AND GROWTH APPARATUS

RELATED APPLICATION DATA

The present application claims priority to Japanese Application No. P10 025371 filed Feb. 6, 1998 which application is incorporated herein by reference to the extent permitted by law.

BACKGROUND OF THE INVENTION

1. Field of the Invention

The present invention relates to a method and apparatus for the growth of a single crystal, especially, β-type barium borate (β-$BaB_2O_4$).

2. Description of the Related Art

There has been a demand for a laser light source with shorter wavelengths in recent years to satisfy the requirements of higher recording density and precise processing in optically technical fields, e.g. optical record playback, precision processing or the like.

As one of the measures satisfying the above demand, animated research and development are now being made to obtain a laser light with a short wavelength by frequency conversion of the laser light from a conventional solid laser utilizing a nonlinear optical material.

A large nonlinear optical effect and high transparency, namely, excellent optical properties with small light loss and high resistance to laser damages are demanded of the nonlinear optical materials.

Among these nonlinear optical materials, a β-$BaB_2O_4$ single crystal is characterized in that it can convert into wavelengths ranging up to a UV (ultraviolet) region and is resistant to laser damages. Hence for the β-$BaB_2O_4$ single crystal, the growth of larger crystals of high quality is desired.

In view of this situation, energetic studies of the β-$BaB_2O_4$ monocrystal growth are ongoing in various fields. The barium borate (β-$BaB_2O_4$) crystal, though it is a congruent melting composition, has the feature in the presence of two phases, a high temperature phase consisting of α-type barium borate(α-$BaB_2O_4$) and a low temperature phase consisting of β-type barium borate (β-$BaB_2O_4$) and the transformation temperature between two phases is about 925° C. (JIANG Aidong et al, Journal of Crystal Growth 79 (1986) 963–969 etc.). Hence the growth of the low temperature phase β-$BaB_2O_4$ crystal is regarded to be difficult in the ordinary lifting growth method since the high temperature phase α-$BaB_2O_4$ crystal is crystallized in this growth method.

The crystal growth is therefore attained in customarily usual methods such as a TSSG (Top Seeded Solution Growth) method which is a type of flux method and a pulling method using a flux under the condition in which the low temperature phase β-$BaB_2O_4$ crystal is crystallized as the primary crystal by using a flux such as $Na_2O$ or the like to lower the melting point or a pulling method using a flux or the like. However, these methods pose the problems of low productivity due to the extremely low crystal growth rate and of deteriorated optical properties due to contamination with flux components in the crystal.

While, Japanese Patent Application Laid-Open (JP-A) No. H1-249698 proposes a pulling method using a self-flux in which external or different kind of fluxes are excluded and excess barium or boron is added to a barium borate composition. This method is improved in terms of exclusion of impurities of a different nature. It, however, has the problem that since a melt composition largely differs from the grown crystal composition, the melt composition varies with the progress of the growth and hence it is difficult to produce large and homogenous crystals.

On the other hand, there has been a recent report in which a β-$BaB_2O_4$ single crystal can be grown by a lifting method even from a melt of barium borate without using a flux at all (JP-A No. H2-279583). In this method, using a high frequency induction heater, induction current is produced in a crucible itself and the crucible is directly heated to set the ambient temperature condition just above the melt, specifically, to form a large temperature gradient just above the melt intentionally thereby growing a β-$BaB_2O_4$ crystal.

Another method is proposed (JP-A No. H9-235198) in which a high frequency induction heater is used similarly and no flux is used. In this method, although the crystal is pulled from a melt of barium borate, the growth of β-$BaB_2O_4$ crystals by pulling can be attained even if the temperature gradient just above the melt is not so steep, specifically, a difference between the temperatures at a height of 10 mm above the melt surface and at the melt surface is between −165° C. and −280° C., in other words, even if the temperature gradient upward from the surface of the melt is as relatively gentle as 165° C./cm to 280° C./cm. Besides, by rather selecting relatively gentle temperature gradient in this manner, this method is improved in the prevention of generations of cracks and striae caused by the strain of the grown crystal which tends to be produced when the temperature gradient above the melt is made steep.

However, any of the aforementioned crystal growth methods using no flux does not necessarily satisfy the internal optical uniformity of the grown β-$BaB_2O_4$ crystal, particularly when the crystal growth method intends to produce large diameter crystals.

SUMMARY OF THE INVENTION

The inventors of the present invention have conducted earnest studies and repeated investigations, and, as a result, found that such a uniformity problem is dependent upon the distribution of the temperature of a melt in a crucible.

As described above, in the conventionally known growth methods using no flux, heating of the crucible to prepare a melt is performed by high frequency induction heating. This heating is carried out on the basis of the ideas that it facilitates the preparation of a desired temperature gradient above a melt surface.

The inventors of the present invention clarified that when induction current is produced in a crucible to directly heat the crucible itself, the uneven induction current produced greatly affects the temperature of the crucible itself, which gives rise to nonuniformity between the temperature of the melt portion, which is directly in contact with the crucible wall, and the ambient temperature at the position apart from the melt portion.

Based on the result of the investigation, the present invention resultantly provides a method and apparatus for growth of a single crystal, particularly, β-$BaB_2O_4$, the method and the apparatus enabling it possible to impart more excellent crystallinity, uniformity in the crystal and hence the uniformity of optical properties and to improve the yield.

According to a first aspect of the present invention, there is provided a method for growth of a single crystal of β-type barium borate (β-$BaB_2O_4$), the method comprising a step of heating a crucible indirectly to grow a single crystal of β-BaB$_2$O$_4$ from a melt of β-BaB$_2$O$_4$ by using a seed crystal of β-BaB$_2$O$_4$ without using a flux within the crucible.

According to another aspect of the present invention, there is provided a growth apparatus comprising a heating furnace provided with a heating means, a crucible disposed in the heating furnace and filled with barium borate (BaB$_2$O$_4$) using no flux, a crystal pulling mechanism to which a seed crystal of β-BaB$_2$O$_4$ is attached, and a transfer means controlling the relative positions of the heating means and the crucible by relative movement of at least one of the heating means and the crucible.

The heating means is such a heating means that the crucible is indirectly heated by the heating means.

In the above apparatus, the relative positions of the heating means and crucible are controlled by the transfer means to thereby select a desired temperature gradient as the temperature gradient in the direction upward from the surface melt of barium borate (BaB$_2$O$_4$) in the crucible and the crystal pulling means is used to grow a single crystal of β-BaB$_2$O$_4$ from the seed crystal of β-BaB$_2$O$_4$ by pulling from the melt of barium borate (BaB$_2$O$_4$) contained in the crucible and using no flux.

The indirect heating herein is different from conventional heating methods in which a high frequency induction current is produced in the crucible itself to heat directly and is a heating method in which a material except for the crucible is heated and heat from the heated portion is conducted by radiation, convection of a heating medium or heat conduction or by heat ray radiation to carry out final heating.

As described above, when the method and apparatus according to the present invention are used, the production of uniform portions in the inside of the pulled crystal is efficiently prevented. This is because ununiform heating of the crucible is difficult to be generated by heating the crucible indirectly whereby the generation of nonuniformity in the temperature of a melt of crystal growth materials filled in the crucible is restrained.

DETAILED DESCRIPTION OF THE PREFERRED EMBODIMENTS

Figure 1:
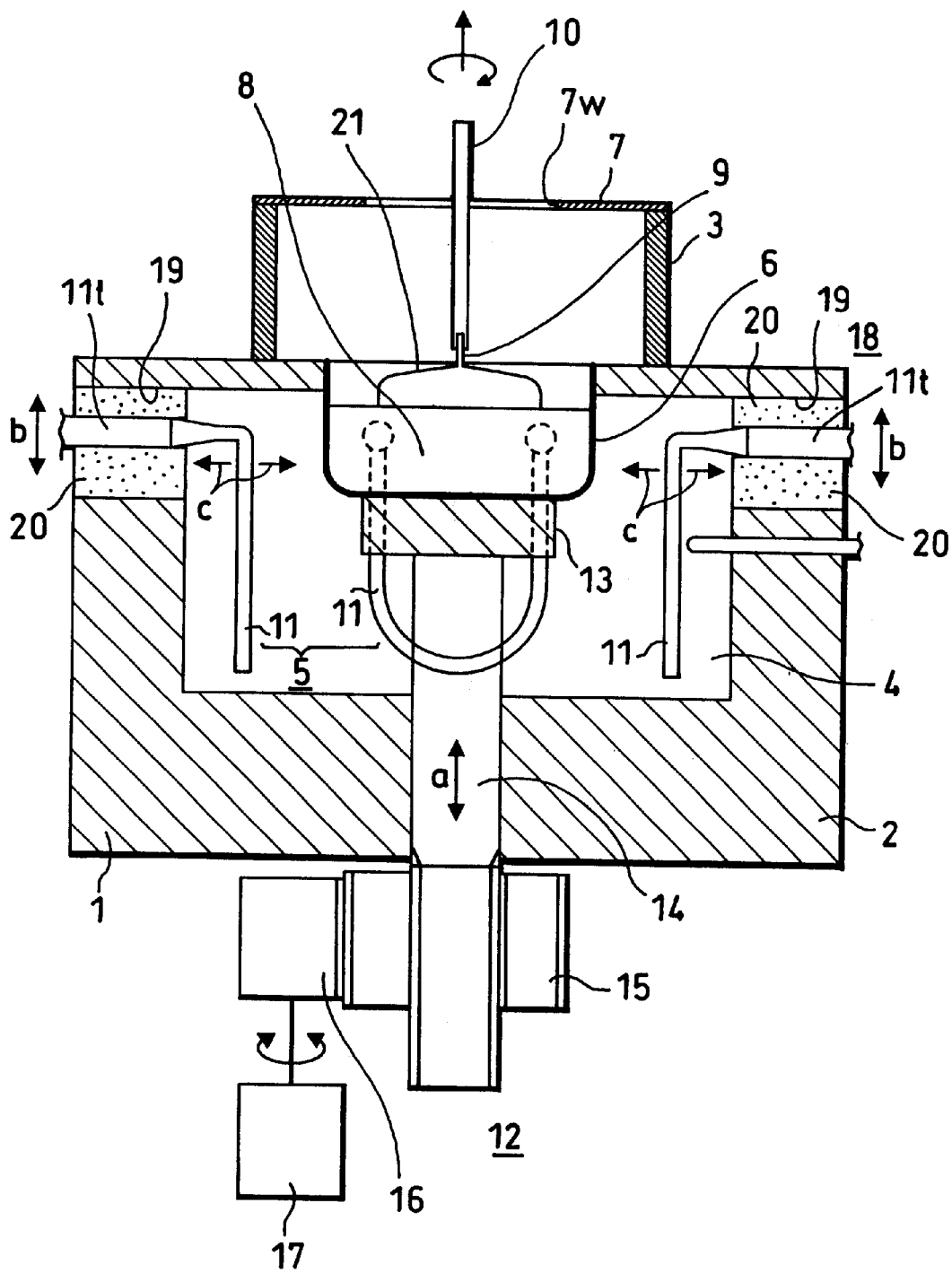
FIG. 1 is a schematically sectional view of an embodiment of a growth apparatus according to the present invention.

The growth method of the present invention is a method for growth of a β-type barium borate (β-BaB$_2$O$_4$) single crystal. In the growth method of the present invention, as described above, a crucible is indirectly heated to grow a β-BaB$_2$O$_4$ single crystal from a melt of barium borate (BaB$_2$O$_4$) with no flux by using a seed crystal of β-BaB$_2$O$_4$.

The temperature at the position above a melt of barium borate (BaB$_2$O$_4$) in the crucible in the growth of the β-BaB$_2$O$_4$ single crystal is designed so that the temperature gradient in a region from the surface of the melt to a height of 10 mm above the liquid level is between 165° C./cm and 600° C./cm. To state it differently, the temperature difference between the surface of the melt and the position at a height of 10 mm (1 cm) above the melt surface is designed to be 165° C. to 600° C. lower than the temperature at the surface of the melt. The reason why the temperature gradient exceeding 165° C./cm is selected as the temperature condition is because when the temperature gradient is more gentle than 165° C./cm, the seed crystal is transformed into α-BaB$_2$O$_4$ and hence β-BaB$_2$O$_4$ crystal growth cannot be attained. On the other hand, a steep temperature gradient exceeding 600° C./cm is not selected because cracks occur in the grown crystal at temperatures above 600° C.

The temperature gradient is preferably between 165° C./cm and 410° C./cm to avoid the occurrence of cracks more positively and more preferably between 165° C./cm and 280° C./cm as disclosed in the foregoing reference: JP-A No. H9-235198, to avoid the occurrence of distortion more certainly.

The crystal growth apparatus according to the present invention by which the aforementioned growth method of the present invention can be practiced comprises a heating furnace provided with a heating means, a crucible disposed in the heating furnace and filled with barium borate (BaB$_2$O$_4$) using no flux, a crystal pulling mechanism to which a seed crystal of β-BaB$_2$O$_4$ is attached, and a transfer means adjusting the positions of the heating means and crucible by relative movement of at least one of the heating means and the crucible.

The heating means is such a heating means by which the crucible is indirectly heated.

The apparatus has a structure in which the relative positions of the heating means and crucible are adjusted by the transfer means to thereby select the aforementioned desired temperature gradient as the temperature gradient in the direction upward from the surface of the melt of barium borate (BaB$_2$O$_4$) in the crucible and the crystal pulling means is used to grow a single crystal of β-BaB$_2$O$_4$ from the seed crystal of β-BaB$_2$O$_4$ by pulling from the melt of barium borate (BaB$_2$O$_4$) contained in the crucible and using no flux.

The heating furnace may be a usual resistance heating furnace structure in which the heating means is a usual heating furnace using electric heating.

In this case, the crucible is indirectly heated, for example, by radiation from a heating furnace, heating of a heating medium, e.g. ambient atmosphere surrounding the crucible using a heating furnace, circulation or convection of a heating medium or heat conduction.

Also, the heating is not limited to the resistance heating but may be carried out by using an infrared ray lamp or the like.

The heating means is arranged in relation to the crucible in such a manner that the peak position of the heating temperature elevated by the heating means reaches the position lower than the surface of a melt of $BaB_2O_4$ in the crucible and temperatures (temperature gradient) at positions above the surface of the melt correspond to the foregoing temperature gradient. For this, the heating means may be a structure provided with a heating section which indirectly heats primarily the vicinity of the bottom of the crucible.

Next, an embodiment of the apparatus according to the present invention will be explained, but the present invention is not limited to this embodiment.

FIG. 1 is a schematically sectional view of an embodiment of a growth apparatus according to the present invention.

This growth apparatus indicates the case of using a resistance heating furnace as a heating furnace 1. Stated it differently, the heating means is structured by using an electric heating furnace.

The heating furnace 1 comprises, for example, an upper furnace 2 and an lower furnace 3. The lower furnace 2 is constituted of, for example, a firebrick which is formed with concave section 4 with an opening at the upper portion thereof.

The lower furnace 2 is provided with a heating means 5. At the opening side of the concave section 4 of the lower furnace 2, located is a crucible 6 which is indirectly heated by the heating means 5 to heat raw material of $BaB_2O_4$ placed in the crucible 6 thereby forming a melt 8 of $BaB_2O_4$.

The upper furnace 3 comprises a cylinder body made of a heat resistant material, for example, alumina $Al_2O_3$, disposed above the opening of the concave section 4 of the lower furnace 2, namely, above the crucible 6, the cylinder body surrounding the opening and projecting upward.

A lid 7 likewise made of alumina $Al_2O_3$, for example, and with an opening 7w at the center thereof is disposed at the upper end of the upper furnace 3.

Besides, a crystal puller 10 provided with a seed crystal 9 of β-$BaB_2O_4$ is installed. The crystal puller 10 has a rod-like crystal pulling body made of, for instance, sapphire and a seed crystal 9 is attached to the bottom end of the pulling body. The crystal puller 10 is rotated by a rotary pulling mechanism (not shown) and pulled up.

The heating means 5 comprises, for instance, a plurality of, for instance, four electric heaters 11 which are arranged around the vertical axis of the location of the crucible 6 at an equal interval, of 90 degrees in this example.

Figure 2:
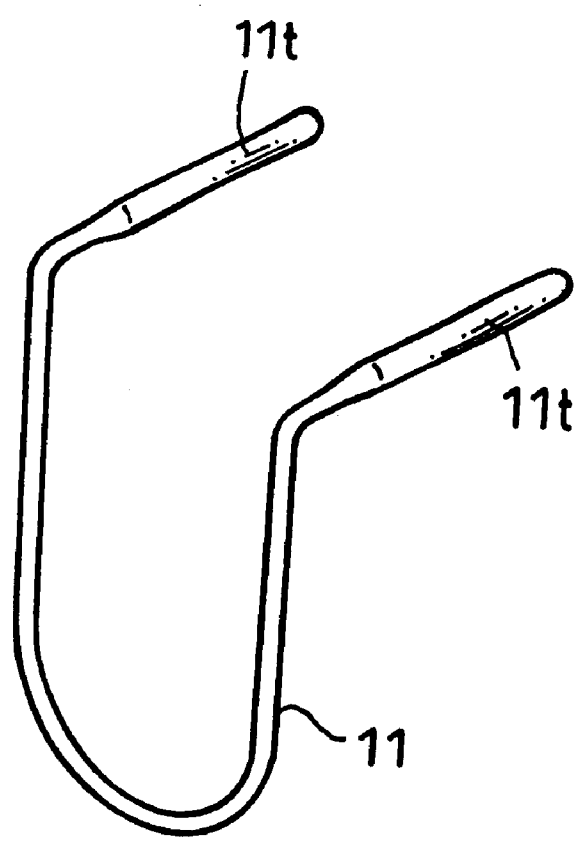
FIG. 2 is a structural view of an embodiment of a heating furnace constituting a heating means of the growth apparatus shown in FIG. 1.

These heaters 11, as shown by its perspective view of FIG. 2, respectively comprise, for instance, a U-like heater and the U-like part of the heaters 11 is disposed at a fixed distance away from the crucible 6 and along the axis of the crucible 6 in the heating furnace 1. Each of these heaters 11 is designed so that its both terminals 11t are led externally from the lower furnace 2 and the terminals 11t of these heaters 11 are connected to each other in such a manner that these heaters 11 are connected to each other in series whereby they are connected to a power source.

These heaters 11 are made of a highly heat-resistant material, for instance, a molybdenum disilicate type, e.g. kantaru Super (manufactured by Kantaru co.,Ltd.) a silicon carbide type, e.g. Erema Specific Heating furnace (manufactured by Takasago Thermal Engineering Co., Ltd.) or the like.

At least one of the heating means 5 and the crucible 6 is provided with a transfer means altering and adjusting the relative positional relation between them.

For instance, a transfer means 12 which can move the crucible 6 in the direction of its axis is installed. The transfer means 12, as shown in, for instance, FIG. 1, comprises, for instance, a vertically movable rod-like support 14 which extends downward along the axis of the crucible 6 through or not through a pedestal 13 made of, for example, a heat-resistant brick which supports the crucible 6, the bottom end of the support being externally led from the lower furnace 2. Moreover, for instance, either a thread groove is formed on or a material formed with a thread groove is attached to the outer periphery of the lower section of the support 14. On the other hand, for instance, a rotor 15 formed with a thread groove, which is to be engaged with the above thread groove, on the inner periphery thereof is disposed in the condition that its movement in the direction of the axis is limited. The rotor 15 is designed to be rotated by a driving motor 17 via a rotation transfer mechanism 16. The rotation of the rotor 15 moves the support 14 vertically as shown by the arrow a thereby moving the crucible 6 vertically.

The heating means 5 is designed to be adjusted in its movement both in a direction along the axis of the crucible 6 and in a direction perpendicular to the axis as shown by the arrows b and c respectively. A transfer means 18 for the movement of the heating means 5 is provided with a rectangular hole 19 drilled into the section of the lower furnace 2 from which both ends of each heater 11 are led out, the aperture 19 having a width of the extent enough to penetrate the ends of the heater 11 and the longitudinal axist direction to the direction of the axis of the crucible 6. In the condition that the ends of each heater 11 are moved under adjustment in the directions of the arrows b and c in the rectangular aperture 19, a heat-resistant material 20 is inserted into the rectangular aperture 19 to arrange to position of each heater 11 and to close the rectangular aperture 19.

In order to attain the growth of a target single crystal of β-$BaB_2O_4$ by pulling with the above-mentioned apparatus, first the relative positions of the crucible 6 and the heating means 5 are selected by the transfer means 12 and 18 mentioned above and further the inside diameter and height of the upper furnace 3, the inside diameter of the opening 7w of the lid 7 and the like are properly selected such that temperature gradient in a vertical direction upward from the surface of the melt 8 corresponds to the foregoing desired temperature gradient. At this time, the surface temperature of the $BaB_2O_4$ melt 8 is designed to be about 1050° C.

Then the crystal puller 10 is used to lower the seed crystal 9 and thereby to bring the seed crystal 9 into contact with the surface of the melt or to dip the seed crystal 9 in the melt. Then, the seed crystal 9 is pulled while it is rotated thereby growing a β-$BaB_2O_4$ single crystal 21 from the seed crystal 9.

Next, an example of the method for growth of β-$BaB_2O_4$ crystal according to the present invention will be explained in detail, which is not intended to be limiting of the present invention thereto.

EXAMPLE 1

This example shows the case of growing a β-$BaB_2O_4$ single crystal by using the growth apparatus of the present invention using a resistance heating furnace shown in FIGS. 1 and 2, namely, a radiation-ray heating furnace.

In this case, $BaCO_3$ of 99.99% purity and $B_2O_3$ of the same 99.99% purity as starting materials were mixed in a ratio by mol of 1:1 and temporarily baked. About 700 g of the mixture was filled in a platinum crucible 6 with a diameter of 80 mm and a depth of 40 mm. An inspection of the temporarily baked product by means of an X-ray powder diffraction method revealed that it included, other than a β-$BaB_2O_4$ structure, an α-$BaB_2O_4$ structure and non-crystal materials, which, however, may be acceptable if these are $BaB_2O_4$ compositions in a molten state.

Then the crucible 6 was heated by heat radiation emitted from the heating means 5 to melt the raw materials in the crucible 6 and to form a temperature gradient of 250° C./cm in a vertical direction ranging from the surface of the melt 8 to a height of 10 mm above the melt surface.

In this condition, a c axis seed crystal 9 of β-$BaB_2O_4$ with each side dimension of 2 mm was grown for 10 hours at a rotation rate of 5 rpm and a pulling rate of 2 mm/hour. At this time, a crystal with a diameter of about 50 mm and the length of the straight cylinder portion being about 15 mm was grown.

The resulting grown crystal had no crack generated and it was confirmed by a powder X-ray diffraction method that it was a β-$BaB_2O_4$ crystal.

COMPARATIVE EXAMPLE 1

In this example, using a customary growth apparatus provided with a high frequency induction heating furnace, specifically, a type of heating furnace designed to heat a platinum crucible directly by high frequency induction heating, instead of indirect heating in the aforementioned Example 1 and using the same raw materials, the same temperature gradient above the surface of the melt as in Example 1 was formed to grow a β-$BaB_2O_4$ crystal with a diameter of about 50 mm.

Figure 3:
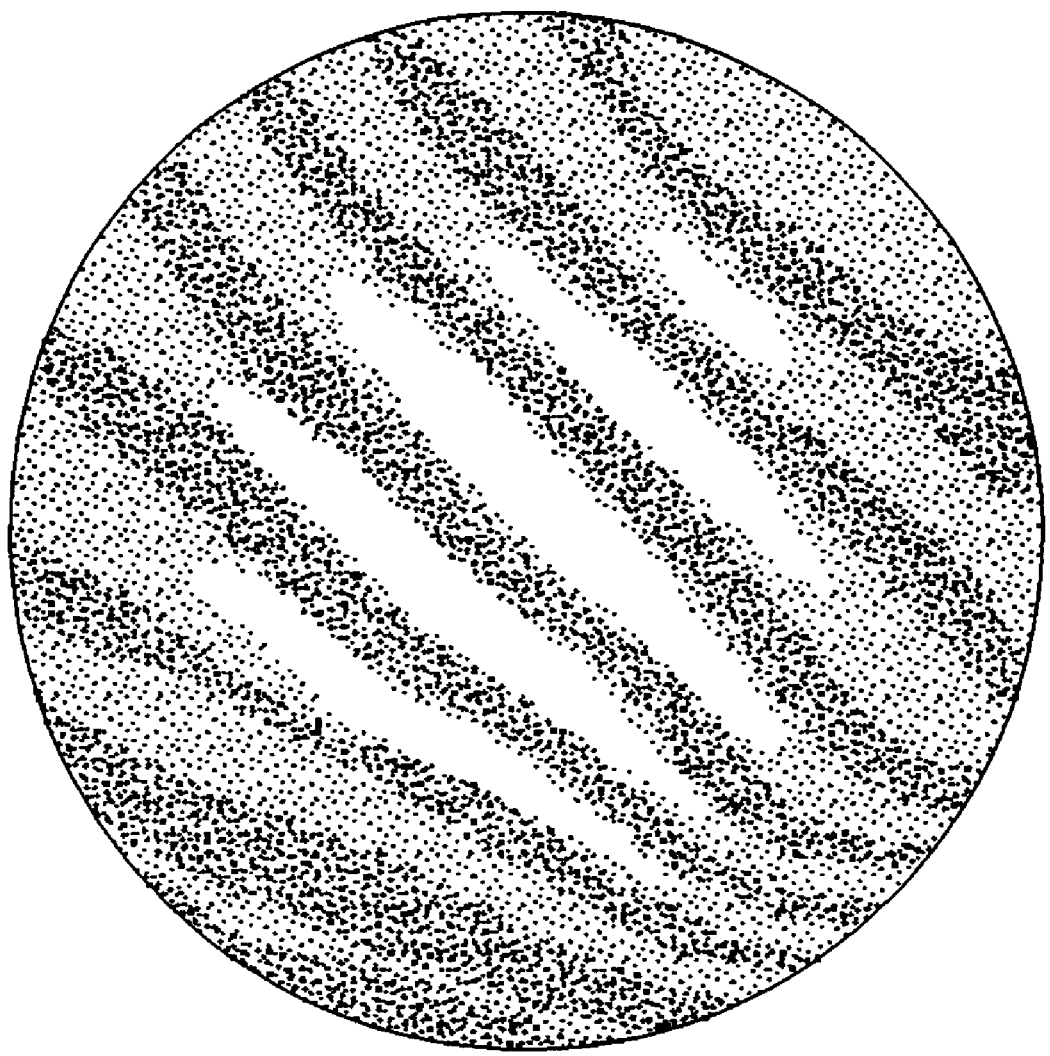
FIG. 3 is a photograph showing the interference pattern of a crystal grown by the method of the present invention.
Figure 13:
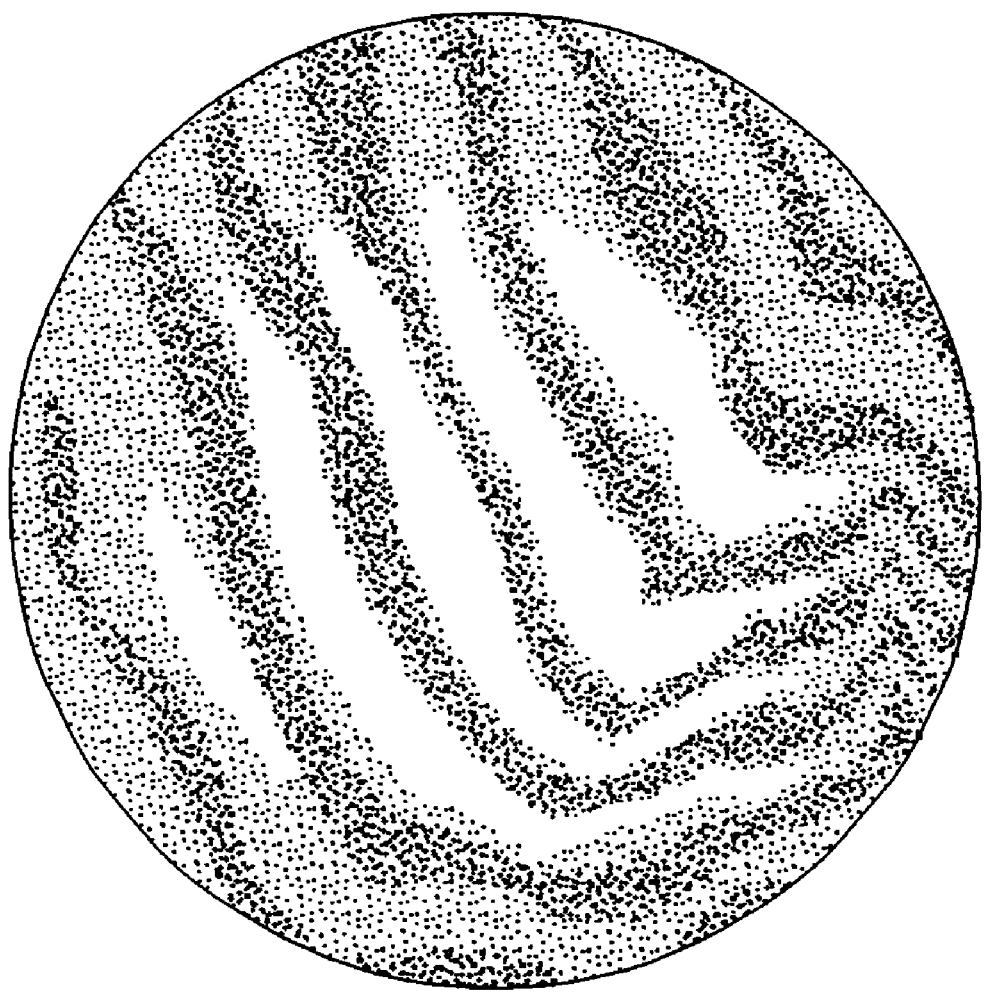
FIG. 13 is a photograph showing the interference pattern of a crystal grown by a comparative example.

It was confirmed by the powder X-ray diffraction method that the crystal grown in Comparative Example 1 was also a β-$BaB_2O_4$ crystal. These β-$BaB_2O_4$ crystals produced in Example 1 and Comparative Example 1 were cut in each side of 14 mm by 20 mm and 8 mm wide by a phase matching plane of the fourth harmonic generation of YAG laser. Both surfaces of the crystal were processed by mirror-finish polishing and then a variation in the refractive index in the crystal was evaluated by using an optical interferometer. In the measurement, a laser interferometer (Model No. SI-10, manufactured by ZYGO) was used and a light source, a He—Ne laser was made into linear polarized light by using a polarizer. FIGS. 3 and 13 show interference patterns when measuring a variation in the refractive index of the inside of a cylinder part with a diameter of 12 mm and a thickness of 7.5 mm, corresponding to the center of each crystal, in the direction of an extraordinary ray. FIG. 3 shows the interference pattern of the crystal grown in Example 1 and FIG. 13 shows the interference pattern of the crystal grown in Comparative Example 1.

That is, according to the method of the present invention, the interference pattern is linear with a uniform interval, showing that the grown crystal is uniform in quality. On the contrary, according to the method heating the crucible itself by high frequency induction heating, the interference pattern curves significantly with ununiform intervals. In other words, in the method of the present invention compared with the conventional method, a significantly uniform crystal and hence a crystal which is uniform in terms of optical properties is grown.

Figure 4:
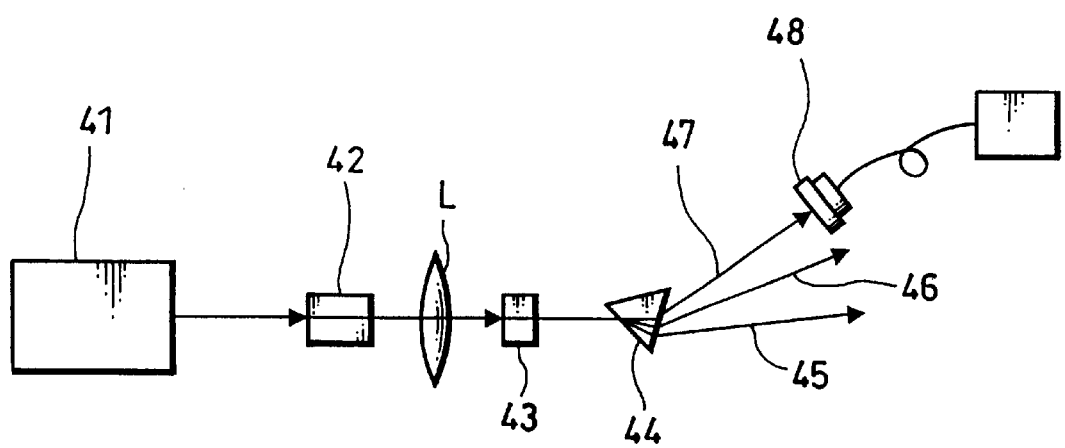
FIG. 4 is a block diagram showing the structure of an optical system measuring the output of the fourth harmonic from the grown crystal.

Next, the output of the fourth harmonic (a wavelength of 266 nm) of YAG laser using the crystals obtained in Example 1 and Comparative Example 1 was measured. FIG. 4 shows a structural view of the optical measuring system.

In this case, a high output laser light, specifically, a laser light, with a wavelength of 1064 nm, a pulse width of 30 ns and a repetitive frequency of 7 kHz, from a Q switch Nd:YAG laser unit 41 was entered into a wave length conversion element 42 made of a LBO ($LiB_3O_5$), whose optical properties required for second harmonic generation were confirmed, to output a laser light with an average power of 2.5 W and a wavelength of 532 nm. This laser light was restricted by a lens L to form an elliptical beam with a minor axis of 70 μm and a major axis of 180 μm and the beam was introduced into a test sample 43 processed from each of the crystals prepared in Example 1 and Comparative Example 1 for fourth harmonic generation. The beam was then separated by a prism 44 into laser lights 45, 46 and 47 with wavelengths of 1064 nm, 532 nm and 266 nm respectively. The laser light 47 with a wavelength of 266 nm was measured by a power meter 48. In this case, the output from any of the crystals prepared in Example 1 and Comparative Example 1 was 550 mW. It was understood that the crystal prepared by the method according to the present invention stood comparison with the conventional products with respect to the wave conversion properties.

EXAMPLE 2

A crystal with a diameter of 50 mm was grown in the same condition as in Example 1 except that only the temperature gradient in a region from the level of the melt to a height of 10 mm above the melt surface was altered to 350° C./cm. There was no crack generated in the crystal grown in this manner and it was confirmed by the powder X-ray diffraction method that it was a β-$BaB_2O_4$ crystal.

Figure 5:
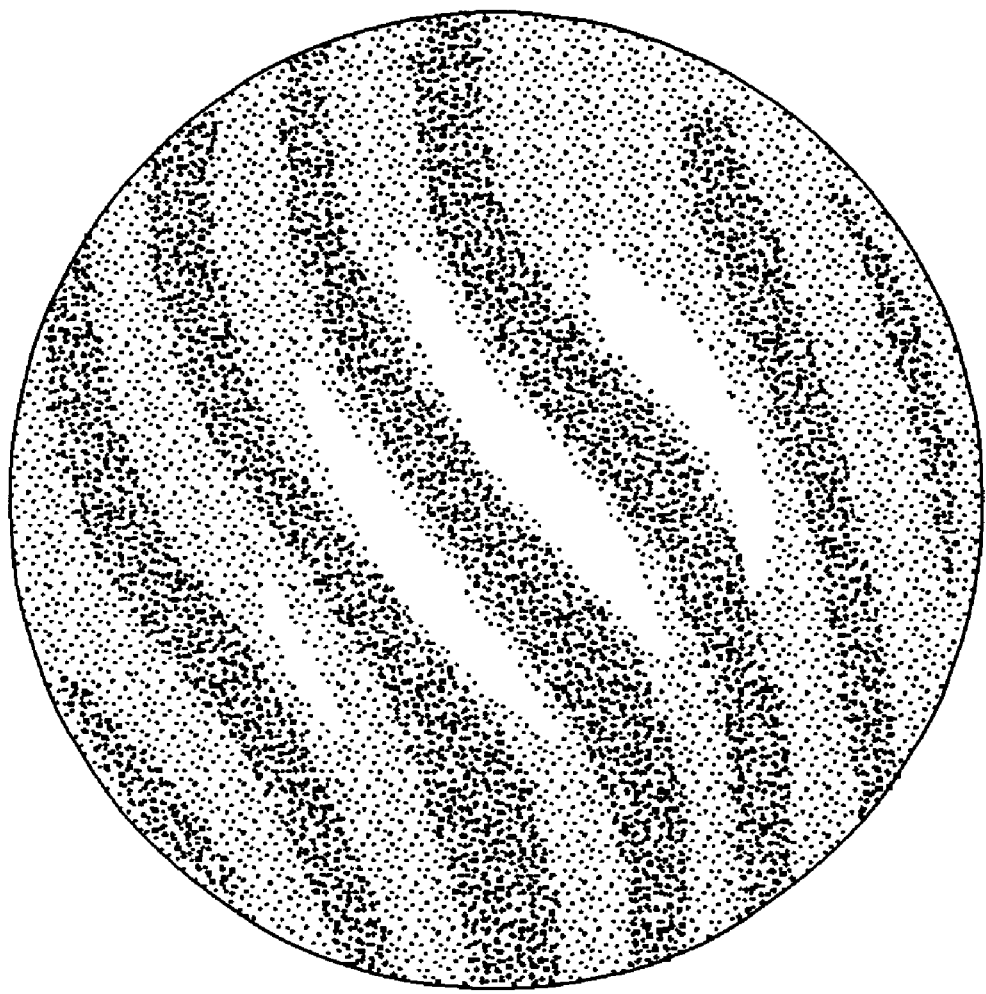
FIG. 5 is a photograph showing the interference pattern of a crystal grown by the method of the present invention.

The crystal prepared in this example was likewise evaluated by an optical interferometer in the same manner as in Example 1 and as a result the interference pattern shown in FIG. 5 was obtained. It was thus confirmed that the crystal grown in Example 2 was also uniform in quality. Moreover, the crystal was measured in terms of the output of the fourth harmonic generation (a wavelength of 266 nm) of YAG laser in the same manner as in Example 1 and as a result the same output as in Example 1 was obtained.

EXAMPLE 3

A crystal with a diameter of 50 mm was grown in the same condition as in Example 1 except that only the temperature gradient in a region from the surface of the melt to a height of 10 mm above the melt surface was altered to 410° C./cm. There was no crack generated in the crystal grown in this manner and it was confirmed by the powder X-ray diffraction method that it was a β-$BaB_2O_4$ crystal.

Figure 6:
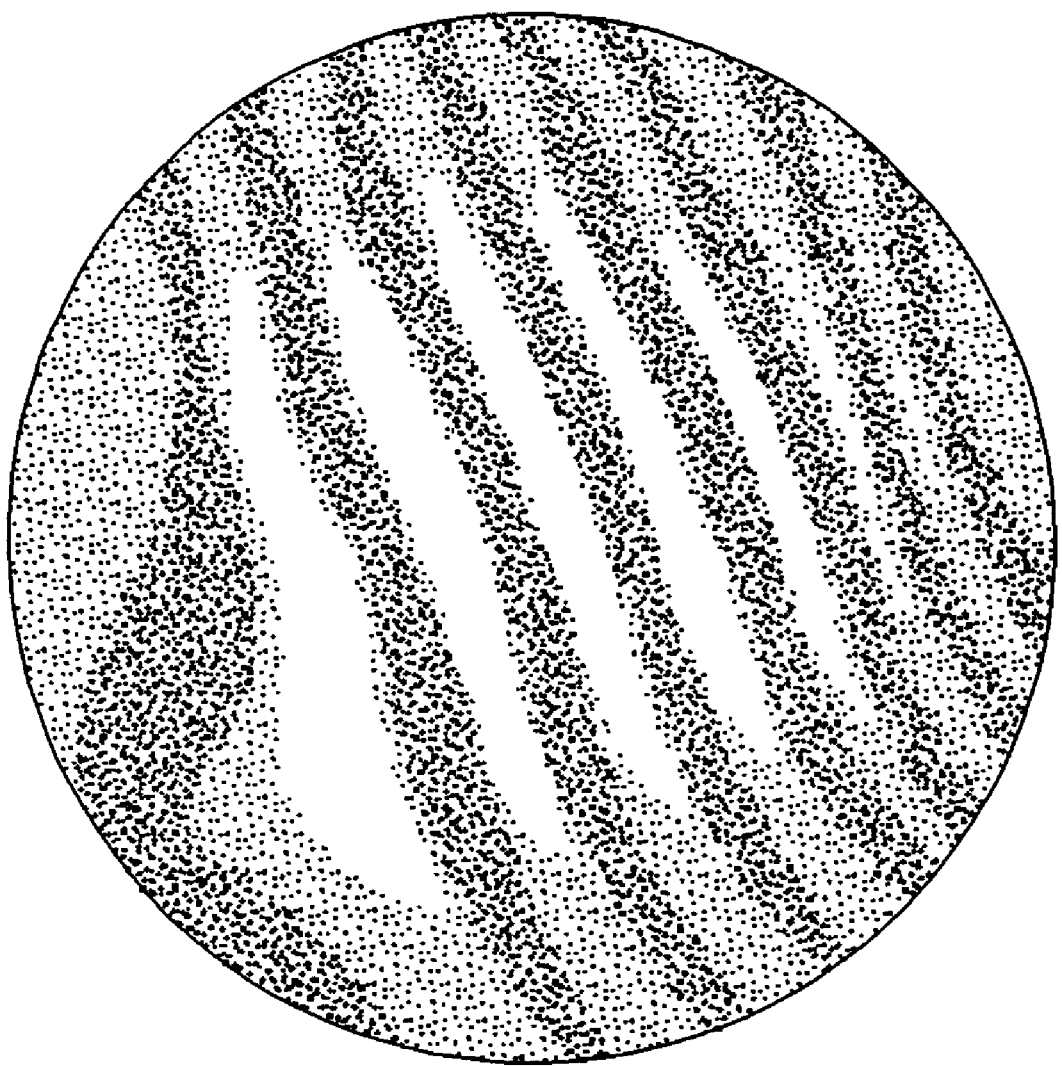
FIG. 6 is a photograph showing the interference pattern of a crystal grown by the method of the present invention.

The crystal prepared in this example was likewise evaluated by an optical interferometer in the same manner as in Example 1 and as a result the interference pattern shown in FIG. 6 was obtained. It was thus confirmed that the crystal grown in Example 3 was also uniform in quality. Moreover, the crystal was measured in terms of the output of the fourth harmonic generation (a wavelength of 266 nm) of YAG laser in the same manner as in Example 1 and as a result the same output as in Example 1 was obtained.

Figure 7:
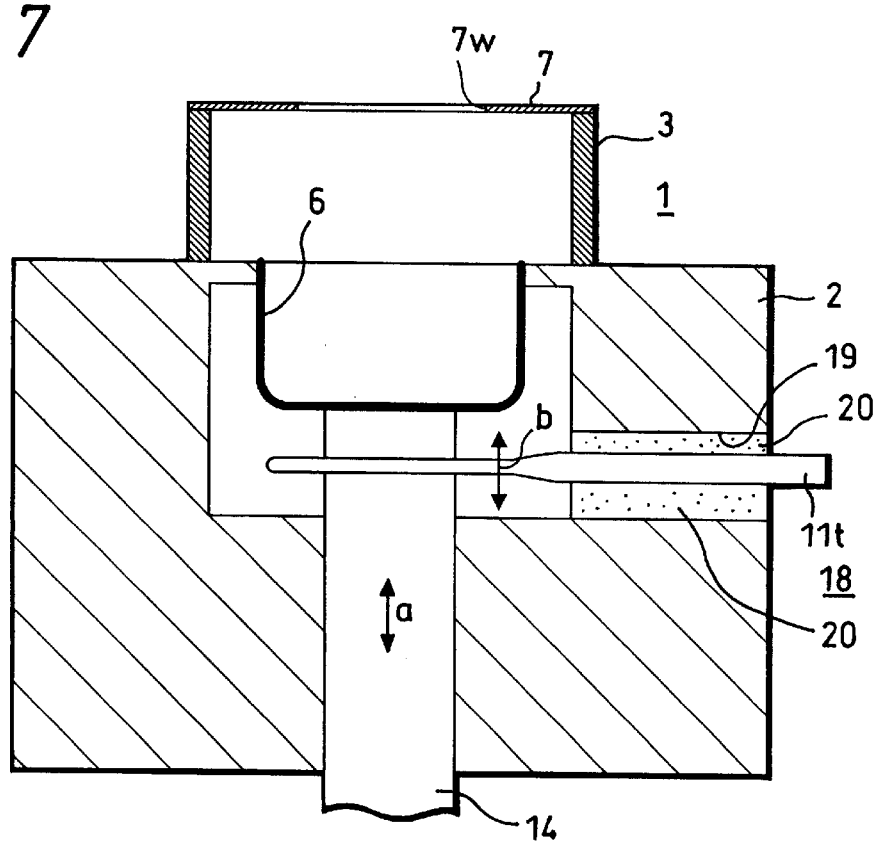
FIG. 7 is a schematically sectional view showing the major part of another embodiment of the apparatus according to the present invention.
Figure 8:
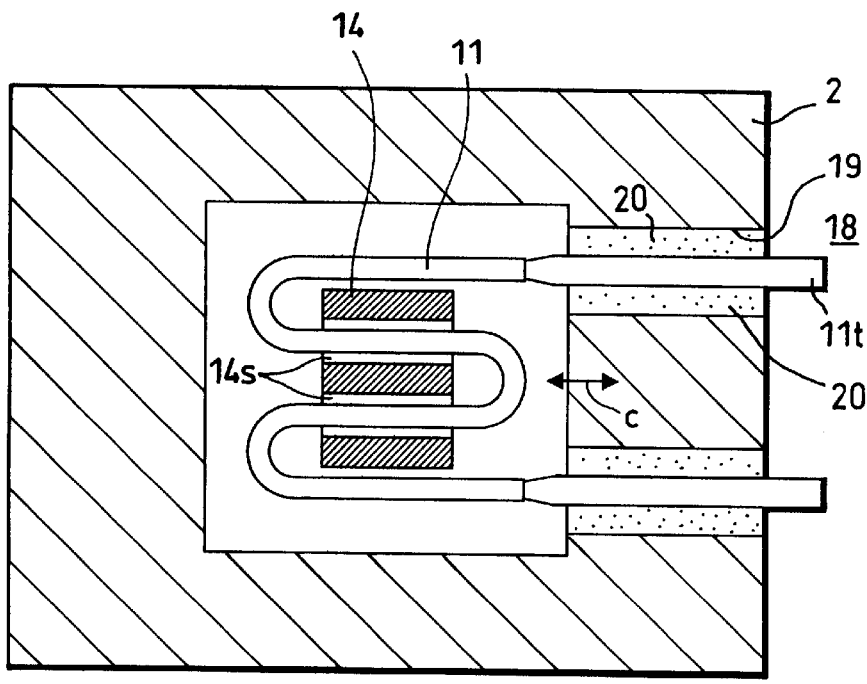
FIG. 8 is a schematically sectional view of the apparatus according to the present invention shown in FIG. 7.

It is easily understood that the apparatus and method of the present invention are not limited to the forgoing embodiments. For instance, in the structure of the radiation-ray heating furnace 1 used in the apparatus of the present invention, the heating means 5 thereof may be varied in its structure. For instance, in order to obtain a desired temperature gradient above the crucible 6, heating means 5 may have a structure in which the heater 11 constituting the heating means 5 is disposed opposite to the bottom of the crucible 6 as shown, for instance, in FIG. 7 which shows a schematically sectional view of the major part of the heating furnace 1 and in FIG. 8 which shows the lateral sectional view of FIG. 7. In FIGS. 7 and 8, parts corresponding to those in FIG. 1 are represented by the same symbols and redundant explanations thereof are omitted. As shown in FIG. 8, this example is the case where the heater 11 is bent in zigzags so that primarily the bottom of the crucible 6 can be uniformly heated by radiation. In this case, the support 14 which vertically moves the crucible 6 may be provided with a slit 14S penetrating the heater 11 therethrough.

Also in this case, as shown in FIGS. 7 and 8, the heater 11 may be provided with the transfer means 18 enabling the movement in the direction b along the axis of the crucible 6 and in the direction c perpendicular to the direction b. The transfer means 18 may have a structure in which an elongated aperture 19 is formed in the wall of the lower furnace 2 to lead out the end of the heater 11 and, in the state in which the position of the heater 11 is selected, the elongated aperture 19 is filled with a heat-resistant material 20 while the penetrating portion of the heater 11 is enclosed in the elongated aperture 19.

Moreover, the transfer means 12 of the crucible 6 may have the same structure as that shown in FIG. 1, though it is not shown. This is an embodiment in which the pedestal 13 of the crucible 6 is omitted.

Figure 9:
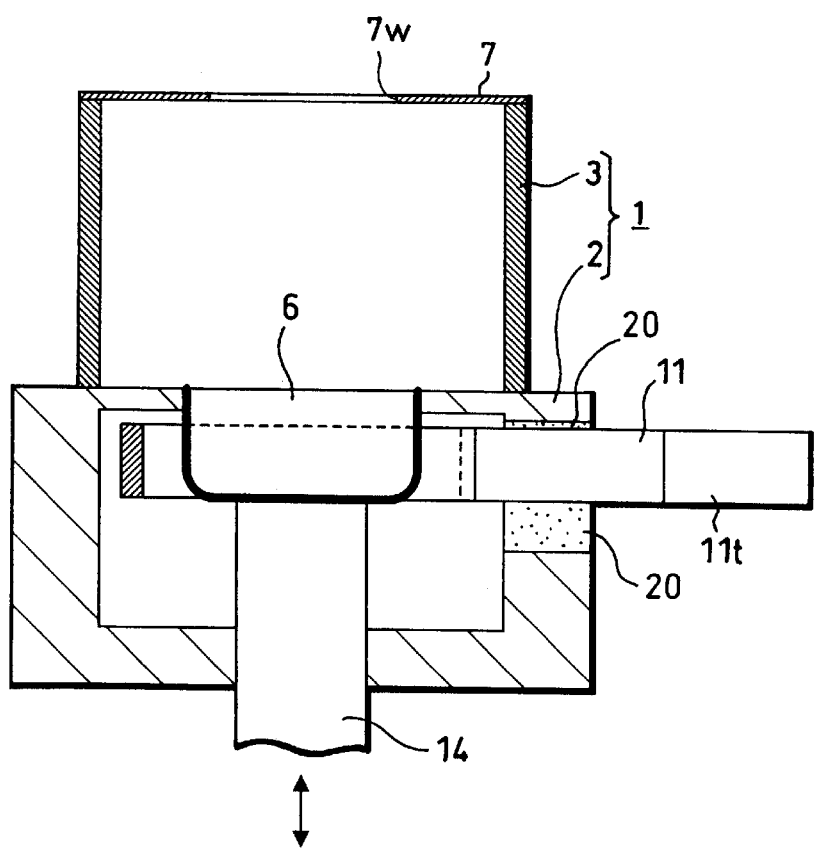
FIG. 9 is a schematically sectional view showing the major part of a further embodiment of the apparatus according to the present invention.
Figure 10A:
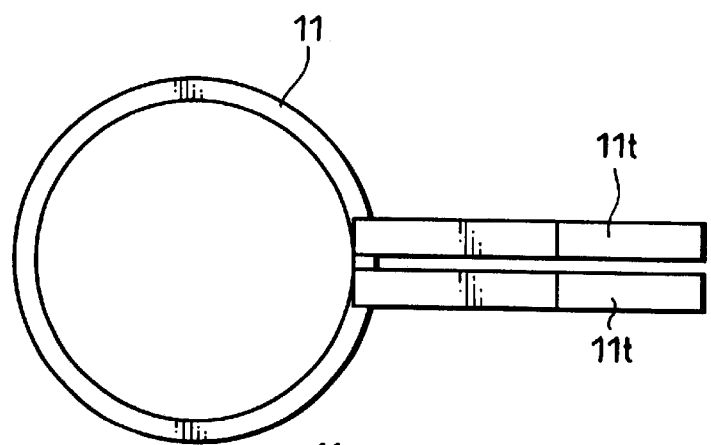
FIGS. 10A and 10B are a plan view and a side view of a heating furnace in the apparatus of the present invention shown in FIG. 9 respectively.
Figure 10B:
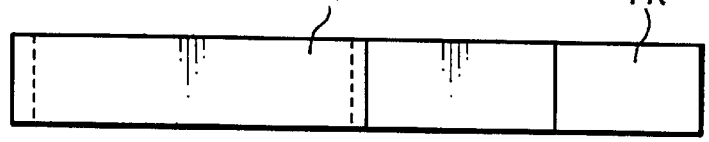

As shown by the major part of the heating furnace 1 in FIG. 9, the heating means 5 may be structured such that a band-like heater 11 formed of SiC is disposed so as to wind around the location of the crucible 6 as shown by a plan view and a side view in FIGS. 10A and 10B.

In this case, also the transfer means 18 enabling the heater 11 to move in the direction of the axis of the crucible 6 may have the same structure as those described in FIGS. 1, 7 and 8. The transfer means 12 of the crucible 6 may have the same structure as that shown in FIG. 1 and the like, though it is not shown.

Figure 11A:
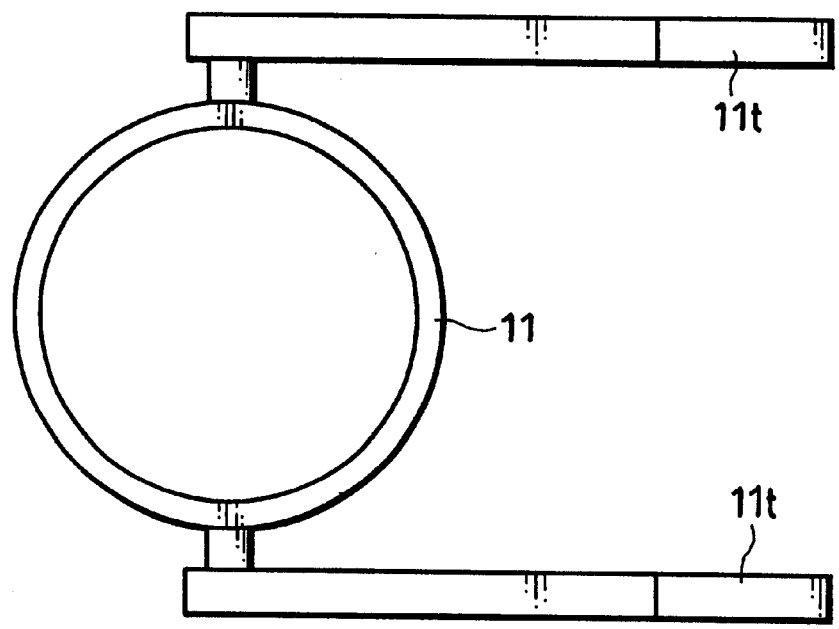
FIGS. 11A and 11B are a plan view and a side view of a heating furnace in another embodiment of the apparatus of the present invention respectively.
Figure 11B:
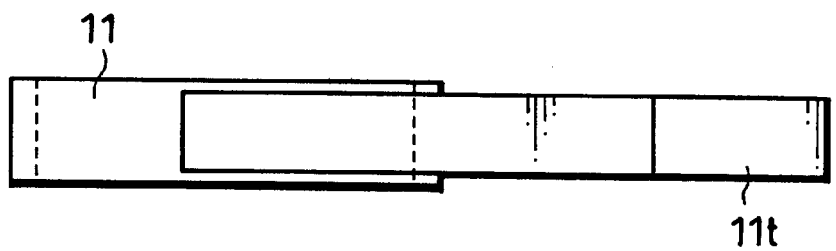

The heater 11 may be made into the ring-like form and the terminal 11t may be led out from both opposite sides of the heating furnace as shown by a plan view and a side view in FIGS. 11A and 11B respectively.

In FIGS. 9 to 11, parts corresponding to those in FIGS. 1, 7 and 8 are represented by the same reference numerals and redundant explanations thereof are omitted.

Figure 12:
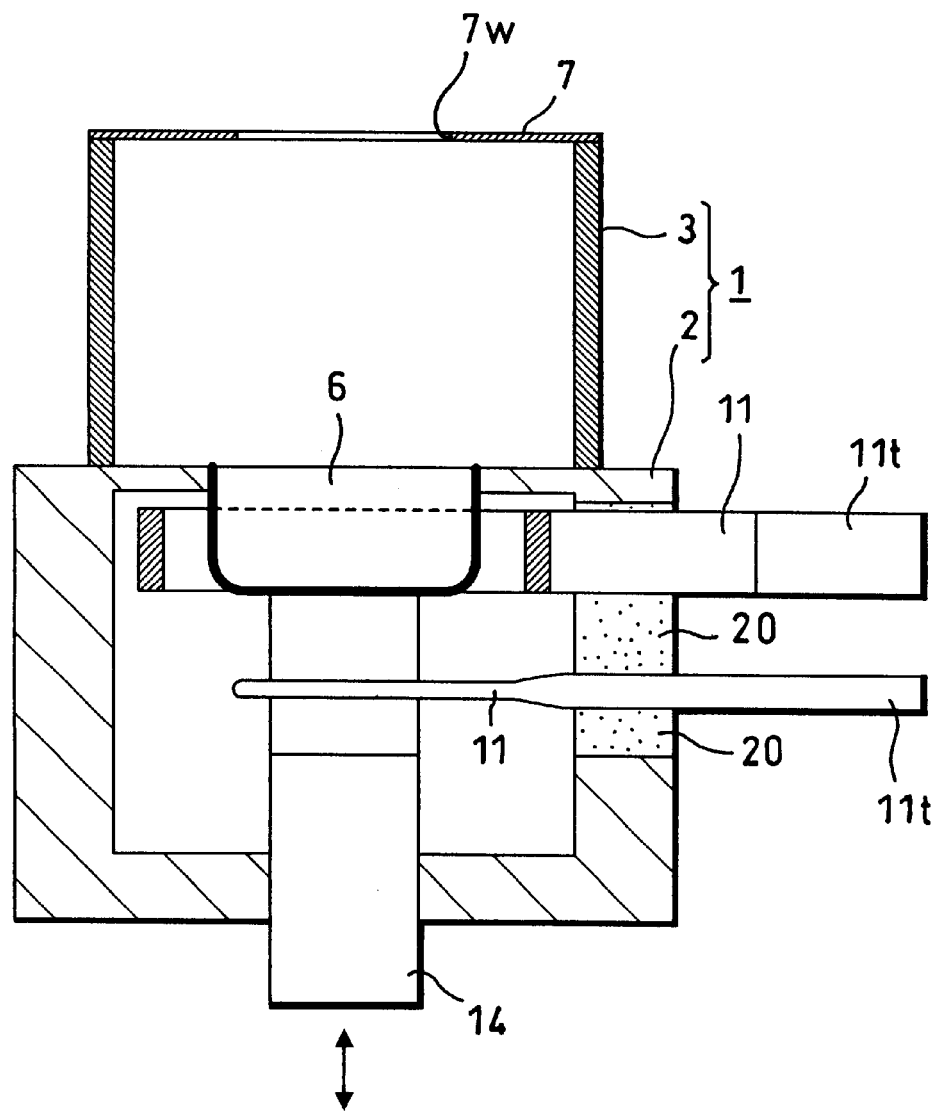
FIG. 12 is a schematically sectional view showing the major part of a still further embodiment of the apparatus according to the present invention.

As shown by a schematically sectional view of the major part of a heating furnace in, for instance, FIG. 12, the heating means may have the structure as shown in FIGS. 7 and 8 and explained in FIGS. 9 to 11, namely, the structure in which the heater 11 is each disposed at the bottom and the outer periphery of the crucible 6.

Also, a variety of structures may be adopted for the heater 11. For instance, an electric heating wire is disposed and wound as a coil-like around the crucible 6 and the heating temperature elevated by the heating means reaches a peak at the position sufficiently lower than the level of the fused liquid contained in the crucible 6.

As described above, the crystal produced by using the method and apparatus of the present invention is surely grown as a β-BaB$_2$O$_4$ single crystal uniform in quality and hence a β-BaB$_2$O$_4$ single crystal whose optical properties are uniform can be obtained. It is considered that this is because, in the present invention, the crucible is heated by indirect heating such as emission of heat radiation rays or the like to avoid direct heating of the crucible itself by electricity which is turned on by high frequency induction current whereby ununiform heating is caused in the crucible with difficulty which restricts the occurrence of ununiform temperatures in the melt of crystal growth materials placed in the crucible.

The above embodiment shows the case where it uses a radiation ray heating furnace in which the heating means has a so-called resistance heating furnace structure using electric heating and any section other than the crucible, specifically, the heater 11 is heated. Heat from the heater 11 is either utilized for so-called radiation heating or used to heat surrounding gas around the crucible which gas is used as a heating medium thereby indirectly heating the crucible 6. However, in addition to the above heating furnace, various indirect heating furnace structures may be adopted. For instance, a radiation-ray heating furnace using a heating means emitting infrared rays, e.g. a lamp, may be adopted.

The transfer means for moving the crucible 6 or the heater 11 is not limited to the foregoing embodiments. For instance, the transfer means 12 for moving the crucible 6 may comprise a supporting base, e.g. heat-resistant brick, for supporting the crucible 6 disposed under the crucible 6 disposed by changing and adjusting the thickness of the supporting base, the relative position to the heater 11 is moved and adjusted.

As aforementioned, in the present invention, the crucible is indirectly heated so that β-BaB$_2$O$_4$ which is uniform in quality and has excellent crystallinity can be produced. Hence, when the crystal of the present invention is used as an optical crystal used as, for example, a frequency conversion element, the yield and hence mass production efficiency thereof can be improved. Thus the crystal and method of the present invention contribute to a reduction in cost and has an industrially large effect.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

FIG. 1

2 LOWER FURNACE
3 UPPER FURNACE
4 CONCAVE SECTION
5 HEATING MEANS
6 CRUCIBLE
7 LID
7w OPENING
8 FUSED LIQUID OF BaB$_2$O$_4$
9 SEED CRYSTAL OF β-BaB$_2$O$_4$
10 CRYSTAL LIFTING MECHANISM
11 HEATING FURNACE
11t TERMINAL
12 TRANSFER MEANS
13 PEDESTAL
14 MOVING SUPPORT
15 ROTOR
16 ROTATION TRANSFER MECHANISM
17 DRIVING MOTOR
18 TRANSFER MEANS
19 ELONGATED APERTURE

20 HEAT-RESISTANT MATERIAL
21 MONOCRYSTAL OF β-BaB$_2$O$_4$

What is claimed is:

1. A method for growth of a single crystal of a-type barium borate (β-BaB$_2$O$_4$), the method comprising a step of heating a crucible indirectly to grow a single crystal of β-BaB$_2$O$_4$ from a melt of BaB$_2$O$_4$, contained in a resistance heating furnace and using no flux, by using a seed crystal of β-BaB$_2$O$_4$ under a condition in which a temperature gradient in a region from a surface of the melt in the crucible to a height of about 10 mm above the melt surface ranges from about 165° C./cm to about 600° C./cm.

2. An apparatus for single crystal growth comprising:

a heating furnace provided with a heating means;

a crucible disposed in said heating furnace and filled with a barium borate (BaB$_2$O$_4$) and using no flux;

a crystal pulling mechanism attached to a seed crystal of β-BaB$_2$O$_4$; and a transfer means for adjusting a positional relation of the heating means to the crucible by moving at least one of the heating means and the crucible, wherein;

the heating means is a heating means for heating said crucible indirectly;

the relative position of the heating means and the crucible is adjusted by the transfer means to thereby select a desired temperature gradient as the temperature gradient in the direction upward from the surface of a melt of barium borate (BaB$_2$O$_4$) in the crucible; and the crystal pulling means is used to grow a single crystal of β-BaB$_2$O$_4$ from the seed crystal of β-BaB$_2$O$_4$ by pulling the seed crystal of β-BaB$_2$O$_4$ from the melt of barium borate (BaB$_2$O$_4$) contained in said crucible and using no flux.

3. The apparatus for single crystal growth of claim 2 wherein the relative position of the heating means and the crucible is adjusted by the transfer means to thereby select a temperature gradient ranging from about 165° C./cm to about 600° C./cm as the temperature gradient in the direction upward from the surface of the melt of barium borate (BaB$_2$O$_4$) in the crucible to a height of about 10 mm above the surface of the melt to attain the growth of a β-BaB$_2$O$_4$ single crystal by pulling the β-BaB$_2$O$_4$ single crystal from said seed crystal of β-BaB$_2$O$_4$.

4. The apparatus for single crystal growth of claim 2 wherein the heating means comprises a heating section heating primarily the vicinity of the bottom of said crucible indirectly.

* * * * *